(12) United States Patent
Jain et al.

(10) Patent No.: US 11,979,145 B1
(45) Date of Patent: May 7, 2024

(54) BACK BIAS CONTROL FOR ALWAYS-ON CIRCUIT SECTION ENABLING LEAKAGE REDUCTION DURING POWER SAVING MODE

(71) Applicant: GlobalFoundries U.S. Inc., Malta, NY (US)

(72) Inventors: Navneet K. Jain, Milpitas, CA (US); Mahbub Rashed, Cupertino, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 18/064,384

(22) Filed: Dec. 12, 2022

(51) Int. Cl.
*H03K 17/687* (2006.01)
*H02M 3/07* (2006.01)
*H03K 3/027* (2006.01)
*H03K 17/693* (2006.01)
*H03K 19/0185* (2006.01)
(Continued)

(52) U.S. Cl.
CPC ........ *H03K 17/6872* (2013.01); *H02M 3/071* (2021.05); *H03K 3/027* (2013.01); *H03K 17/693* (2013.01); *H03K 19/018521* (2013.01); *H03K 19/1733* (2013.01); *H03K 19/20* (2013.01)

(58) Field of Classification Search
CPC ........ H03K 3/027; H03K 17/51; H03K 17/56; H03K 17/687; H03K 17/6871; H03K 17/6872; H03K 17/693; H03K 19/0008; H03K 19/0013; H03K 19/0175; H03K 19/017509; H03K 19/02; H03K 19/173; H03K 19/1733; H03K 19/20; H03K 2217/0018; G05F 3/205; H02M 3/071; G11C 5/14; G11C 5/145; G11C 5/146
See application file for complete search history.

(56) References Cited

U.S. PATENT DOCUMENTS 6,097,113 A * 8/2000 Teraoka ............. H03K 19/0013
327/544
6,333,571 B1 * 12/2001 Teraoka ............. H03K 19/0013
307/115

(Continued)

OTHER PUBLICATIONS

Kim et al., "Optimal Body Biasing for Minimum Leakage Power in Standby Mode," May 27, 2007 IEEE International Symposium on Circuits and Systems, pp. 1161-1164.

*Primary Examiner* — Long Nguyen
(74) *Attorney, Agent, or Firm* — David Cain; Hoffman Warnick LLC

(57) ABSTRACT

A disclosed structure includes a section (e.g., an always on (AON) section) with at least one N-channel transistor (NFET) and at least one P-channel transistor (PFET). The structure further includes a switch with first and second inputs connected to receive positive and negative bias voltages, respectively, and first and second outputs connected to bias back gates of the NFET(s) and PFET(s), respectively, of the section. The structure is also configured to generate select signals for controlling the input-to-output connections established by the switch. In a power saving mode, these signals cause the switch to establish input-to-output connections resulting only in reverse back biasing of the NFET(s) and PFET(s) of the section. In a functional mode, these signals can cause the switch to establish input-to-output connections resulting in either forward back biasing or reverse back biasing. Also disclosed is a method of operating the structure.

20 Claims, 8 Drawing Sheets

(51) Int. Cl.
*H03K 19/173* (2006.01)
*H03K 19/20* (2006.01)

(56) References Cited

U.S. PATENT DOCUMENTS

| | | |
|---|---|---|
| 8,560,931 B2 | 10/2013 | Seshadri et al. |
| 10,340,899 B2 | 7/2019 | Purushothaman et al. |
| 10,678,287 B2 | 6/2020 | Siddiqi et al. |
| 2009/0058484 A1 | 3/2009 | Rao et al. |
| 2010/0060319 A1 | 3/2010 | Hoberman et al. |

\* cited by examiner

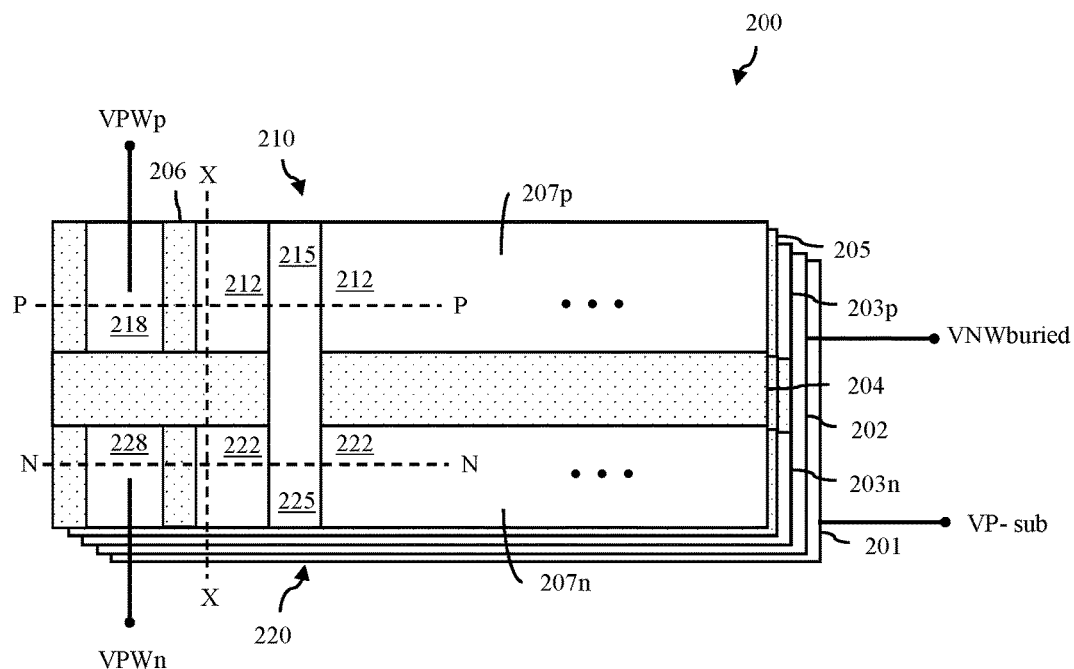
FIG. 2A
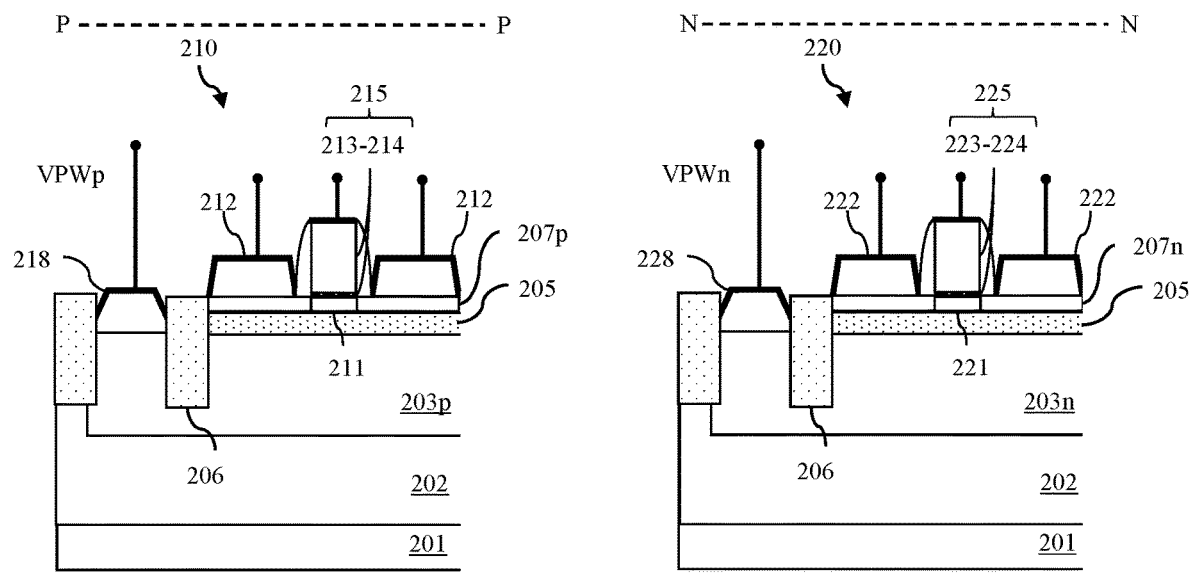
FIG. 2B
FIG. 2C

BACK BIAS CONTROL FOR ALWAYS-ON CIRCUIT SECTION ENABLING LEAKAGE REDUCTION DURING POWER SAVING MODE

BACKGROUND

The present disclosure relates to always on (AON) sections of an integrated circuit (IC) and, more particularly, to embodiments of a structure and method for reducing leakage current in an AON section of an IC during a power saving mode.

ICs are typically designed to enter a power saving mode of operation (referred to herein interchangeably as a retention mode, standby mode or a suspend mode) when idle. During the power saving mode in any given IC, some sections of the IC will be powered down (i.e., will stop receiving a power supply) to save power. Other sections (referred to in the art as "always on" (AON) sections) will not be powered down and instead will continuously receive a power supply. AON sections include, for example, logic control blocks for controlling modes of operation, event monitors for triggering wake-up, power supplies, clocks, input/output devices (e.g., input buffers), retention memory, etc. Since the AON sections continue to be powered on during the power saving mode, leakage current in these AON sections continues to be a source of power consumption.

SUMMARY

Disclosed herein are embodiments of a structure. The structure can include a section of a circuit. The circuit can be operable in a power saving mode and the section can be an always-on (AON) section. The section can include at least one N-channel transistor and at least one P-channel transistor. The structure can further include a multi-way switch, which has two inputs and two outputs. The two inputs can include a first input connected to receive a positive bias voltage and a second input connected to receive a negative bias voltage. The two outputs can include a first output connected to back bias the at least one N-channel transistor and a second output connected to back bias the at least one P-channel transistor. The multi-way switch can be connected to receive select signals (e.g., from switch control circuitry) and any electrical connections established by the multi-way switch between the two inputs and the two outputs can be controlled by these select signals. In the power saving mode, the select signals can specifically cause the multi-way switch to establish electrical connections between the two inputs and the two outputs resulting in reverse back biasing of the at least one N-channel transistor and the at least one P-channel transistor.

Some embodiments of the structure disclosed herein can include a section of a circuit. The circuit can be operable in a power saving mode and in a functional mode and the section can be an always-on (AON) section. The section can include at least one N-channel transistor and at least one P-channel transistor. The structure can further include a multi-way switch, which has two inputs and two outputs. The two inputs can include a first input connected to receive a positive bias voltage and a second input connected to receive a negative bias voltage. The two outputs can include a first output connected to back bias the at least one N-channel transistor and a second output connected to back bias the at least one P-channel transistor. The structure can further include a control signal generator and a level shifter. The control signal generator can generate and output a control signal and an inverted control signal that are dependent on a mode of operation of the circuit (i.e., on whether the circuit is operating in the functional mode or the power saving mode). The level shifter can be connected to receive the control signal and the inverted control signal from the control signal generator and can generate and output select signals to the multi-way switch based on the control signal and the inverted control signal. The multi-way switch can receive the select signals from the level shifter and, in the power saving mode, these select signals can specifically cause the multi-way switch to establish electrical connections between the two inputs and the two outputs resulting in reverse back biasing of the at least one N-channel transistor and the at least one P-channel transistor.

Also disclosed herein are embodiments of an operating method. The method can include receiving select signals. The select signals can be received by a multi-way switch of a structure. The structure can include a section of a circuit and the multi-way switch. The section can include at least one N-channel transistor and at least one P-channel transistor. The multi-way switch can have two inputs and two outputs. The two inputs can include a first input connected to receive a positive bias voltage and a second input connected to receive a negative bias voltage. The two outputs can include a first output connected to back bias the at least one N-channel transistor and a second output connected to back bias the at least one P-channel transistor. The circuit can be operable in a power saving mode and the section can be an always-on (AON) section. The method can further include establishing, by the multi-way switch in response to the select signals in the power saving mode, electrical connections between the two inputs and the two outputs resulting in reverse back biasing of the at least one N-channel transistor and the at least one P-channel transistor in the section.

It should be noted that all aspects, examples and features of the disclosed embodiments mentioned above and discussed in greater detail below can be combined in any technically possible way.

BRIEF DESCRIPTION OF THE DRAWINGS

The present disclosure will be better understood from the following detailed description with reference to the drawings, which are not necessarily drawn to scale and in which:

FIG. 2A is a layout diagram and FIGS. 2B-2D are different cross-section diagrams illustrative of fully depleted transistors having back gates that can be incorporated into an always-on (AON) section of the structure of FIG. 1;

DETAILED DESCRIPTION

Figure 1:
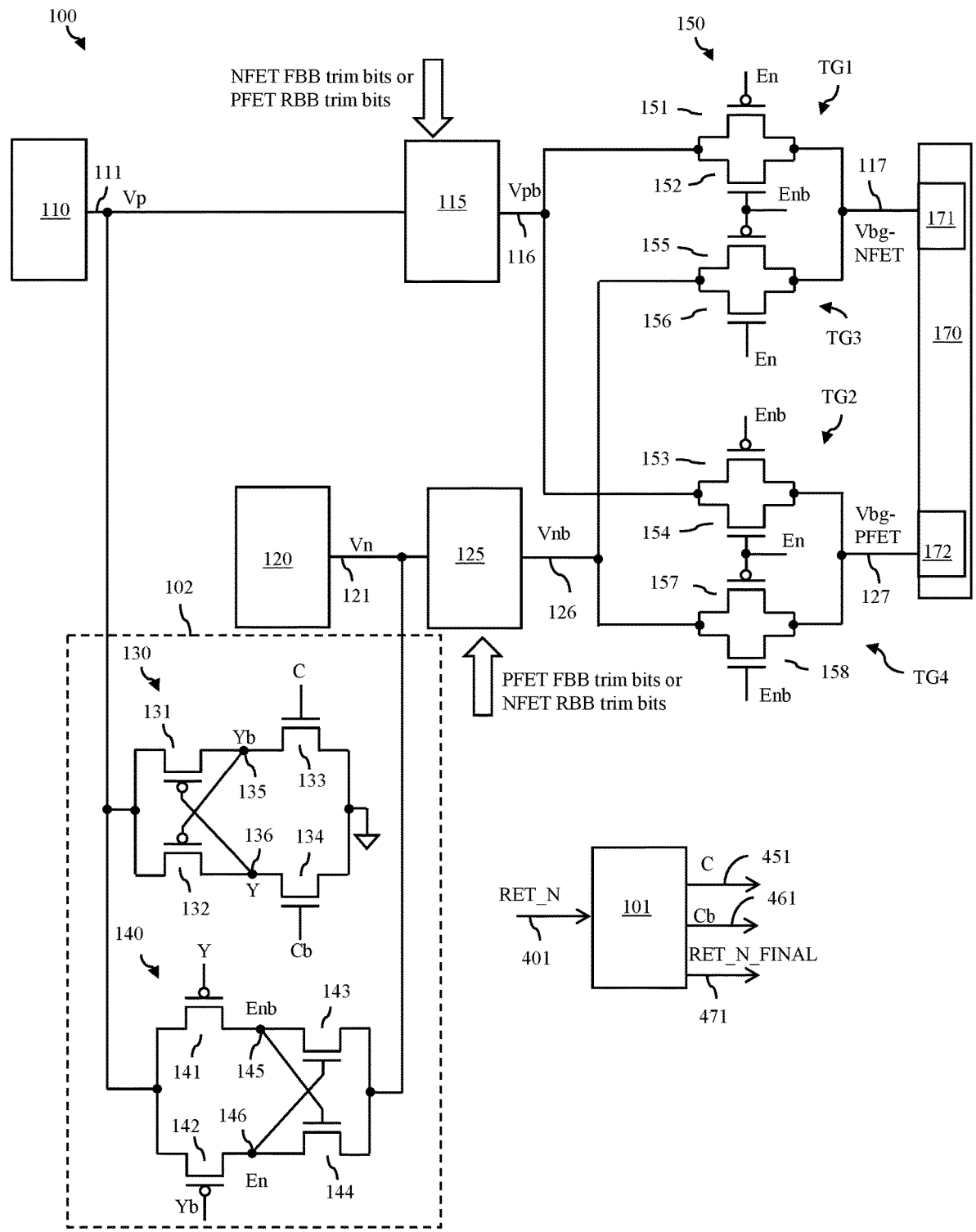
FIG. 1 is a schematic diagram illustrating a disclosed embodiment of an integrated circuit (IC) structure.

As mentioned above, ICs are typically designed to enter a power saving mode of operation (referred to herein interchangeably as a retention mode, standby mode or a suspend mode) when idle. During the power saving mode in any given IC, some sections of the IC will be powered down (i.e., will stop receiving a power supply) to save power. Other sections (referred to in the art as "always on" (AON) sections) will not be powered down and instead will continuously receive a power supply. AON sections include, for example, logic control blocks for controlling modes of operation, event monitors for triggering wake-up, power supplies, clocks, input/output devices (e.g., input buffers), retention memory, etc. Since the AON sections continue to be powered on during the power saving mode, leakage current in these AON sections continues to be a source of power consumption. Techniques to minimize AON section leakage have included reducing the voltage level of the power supply to the AON section and/or reducing device size in the AON section. However, such techniques tend to negatively affect section performance and can increase wake-up time.

In view of the foregoing, disclosed herein are embodiments of an integrated circuit (IC) structure in an advanced semiconductor-on-insulator technology platform, such as a fully depleted silicon-on-insulator (FDSOI) technology platform, in which field effect transistors can have back gates suitable for forward back biasing for decreased threshold voltage (VT) or reverse back biasing for increased VT. The structure can include a section of a circuit. The circuit can be operable in a power saving mode and in a functional mode and the section at issue can be an always-on (AON) section. This section can include at least one N-channel transistor (NFET) and at least one P-channel transistor (PFET). The structure can further include a multi-way switch with first and second inputs connected to receive positive and negative bias voltages, respectively, and first and second outputs connected to back bias (i.e., to bias back gates of) the NFET(s) and the PFET(s), respectively, of the section. The structure can further be configured (e.g., with switch control circuitry) to generate select signals for controlling the input-to-output connections established by the multi-way switch. In a power saving mode, the generated select signals can specifically cause the multi-way switch to establish only those input-to-output connections that will result in reverse back biasing of the NFET(s) and PFET(s) in the AON section to raise the VTs thereof and thereby minimize leakage current from the AON section during power saving mode operation. Thus, power saving in the AON section can be achieved without reducing the size of devices therein and, thereby without negatively affecting performance or increasing wake-up time. In a functional mode, the generated select signals can cause the multi-way switch to establish input-to-output connections resulting in either forward back biasing or reverse back biasing of the NFET(s) and the PFET(s) of the section. Also disclosed herein are embodiments of a method of operating the IC structure.

More particularly, FIG. 1 is a schematic diagram illustrating a disclosed embodiment of an integrated circuit (IC) structure 100 (hereinafter structure 100). The structure 100 can, for example, be formed using an advanced semiconductor-on-insulator technology platform (e.g., a fully depleted silicon-on-insulator (FDSOI) technology platform).

Those skilled in the art will recognize that, in advanced semiconductor-on-insulator technology platforms such as in the FDSOI technology platform, a semiconductor structure is typically formed on a hybrid semiconductor substrate. Such a hybrid semiconductor substrate typically includes a base semiconductor substrate, which is monocrystalline in structure, and, on the base semiconductor substrate, semiconductor-on-insulator regions (e.g., SOI regions) and bulk semiconductor regions (also referred to as hybrid semiconductor regions). Each semiconductor-on-insulator region can include a monocrystalline semiconductor layer on an insulator layer above the base semiconductor substrate. Each bulk semiconductor region can include monocrystalline epitaxial semiconductor layer (e.g., a monocrystalline silicon layer) immediately adjacent to the top surface of the base semiconductor substrate.

The semiconductor-on-insulator regions can be used as devices regions including, for example, fully depleted planar field effect transistors (FETs).

Figure 2D:
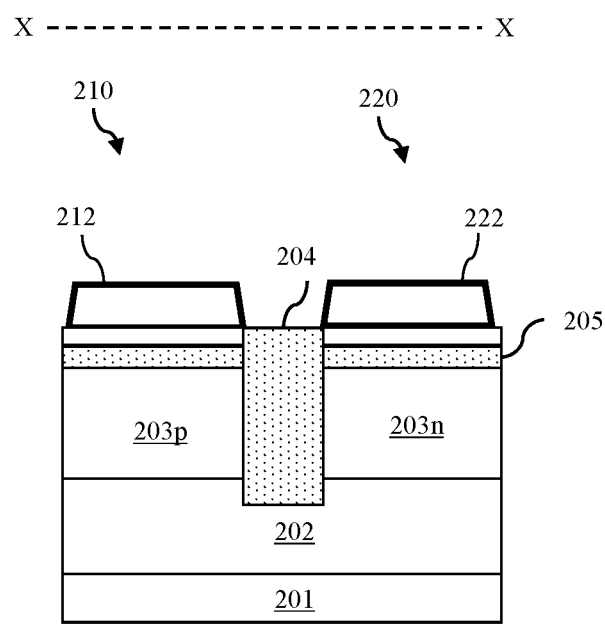

FIG. 2A is a layout diagram and FIGS. 2B-2D are different cross-section diagrams, respectively, illustrative of a semiconductor structure 200 including fully depleted planar FETs (e.g., see the P-channel FET (PFET) 210 and the N-channel FET (NFET) 220) that can be formed using such an advanced semiconductor-on-insulator technology platform (e.g., an FDSOI technology platform). The semiconductor structure 200 can include a base semiconductor substrate 201 (e.g., a monocrystalline silicon substrate or a monocrystalline substrate of any other suitable semiconductor material). The semiconductor substrate can be doped so as to have P-type conductivity at a relatively low conductivity level (e.g., so as to be a P– substrate).

The semiconductor structure 200 can further include a deep Nwell 202 (e.g., a deep implant region doped so as to have N-type conductivity) in the P– substrate 201. The semiconductor structure 200 can further include adjacent, parallel, Pwells 203p, 203n in the P– substrate 201. The Pwells 203p, 203n can be shallower than and can traverse the deep Nwell 202 so that they are isolated from a lower portion of the P– substrate 201.

The semiconductor structure 200 can further include a semiconductor-on-insulator region. That is, the semiconductor structure 200 can further include an insulator layer 205 on the top surface of the P– substrate 201 above the Pwells 203p, 203n. The insulator layer 205 can, for example, be a silicon dioxide ($SiO_2$) layer (also referred to herein as a buried oxide (BOX) layer) or a layer of any other suitable insulator material. The semiconductor structure 200 can further include a monocrystalline semiconductor layer on the insulator layer 205. The monocrystalline semiconductor layer can be a monocrystalline silicon (Si) layer or a monocrystalline layer of any other suitable monocrystalline semiconductor material.

The semiconductor structure 200 can further include a deep isolation region 204 (also referred to herein as a defense layer), which is oriented parallel to the Pwells 203p, 203n and extends vertically through the semiconductor layer to divide it into a semiconductor layer 20'7p for PFETs and a semiconductor layer 207n for NFETs. This deep isolation region 204 can further extend vertically through the insulator layer 205 and into the P– substrate 201 between the Pwells 203p, 203n and into the deep Nwell 202 so as to electrically isolate the Pwells 203p, 203n from each other.

The semiconductor structure 200 can include one or more PFETs (e.g., see PFET 210) on the semiconductor layer 207p. Each PFET 210 can include a channel region 211 within the semiconductor layer 207p positioned laterally between source/drain regions 212. Each PFET 210 can further include a front gate 215 on the top surface of the semiconductor layer 207p aligned above the channel region 211. The front gate 215 can include a gate dielectric layer immediately adjacent to the top surface of the semiconductor layer 207p and a gate conductor layer 214 on the top surface of the gate dielectric layer 213. The source/drain regions 212 can include doped epitaxial semiconductor layers on the top surface of the semiconductor layer 207p on either side of the front gate 215. Gate sidewall spacers on opposing sidewalls of the gate structure can isolate the front gate 215 from the source/drain regions 212. Those skilled in the art will recognize that, for a PFET, the source/drain regions 212 can have P-type conductivity at a relatively high conductivity level (e.g., P+ conductivity). In such an advanced semiconductor-on-insulator technology platform (e.g., an FDSOI technology platform), the channel region 211 will typically be undoped (i.e., intrinsic semiconductor material). However, alternatively, the channel region 211 could be doped so as to have P-type conductivity at a relatively low conductivity level (e.g., P− conductivity).

The semiconductor structure 200 can include one or more NFETs (e.g., see NFET 220) on the semiconductor layer 207n. Each NFET 220 can include a channel region 221 within the semiconductor layer 207n positioned laterally between source/drain regions 222. Each NFET 220 can further include a front gate 225 on the top surface of the monocrystalline semiconductor layer 207n aligned above the channel region 221. The front gate 225 can include a gate dielectric layer immediately adjacent to the top surface of the semiconductor layer 207n and a gate conductor layer 224 on the top surface of the gate dielectric layer 223. The source/drain regions 222 can include doped epitaxial semiconductor layers on the top surface of the semiconductor layer 207n on either side of the front gate 225. Gate sidewall spacers on opposing sidewalls of the gate structure can isolate the front gate 225 from the source/drain regions 222. Those skilled in the art will recognize that, for an NFET, the source/drain regions 222 can have N-type conductivity at a relatively high conductivity level (e.g., N+ conductivity). In such an advanced semiconductor-on-insulator technology platform (e.g., an FDSOI technology platform), the channel region 221 will typically be undoped (i.e., intrinsic semiconductor material). However, alternatively, the channel region 221 could be doped so as to have N-type conductivity at a relatively low conductivity level (e.g., N− conductivity).

The semiconductor structure 200 can further include hybrid semiconductor region(s) (also referred to herein as a bulk semiconductor region(s)) located, for example, at one end or both ends of the Pwells. The hybrid semiconductor region(s) can include Pwell contact regions 218 and 228 on either side of the deep isolation region 204 for contacting the Pwells 203p and 203n, respectively. The Pwell contact regions 218 and 228 can, for example, by P+ epitaxial semiconductor layers on the top surface of the substrate 201 immediately adjacent to the Pwells 203p and 203n. The Pwell contact regions 218 and 228 can be electrically isolated from the PFETs and NFETs on the same side of the deep isolation region, respectively, by shallow trench isolation (STI) regions 206. Such Pwell contact regions 218 and 228 can be contacted to facilitate biasing of the Pwells. Thus, for each FET, the Pwell and the section of insulator layer 205 below the channel region can effectively function as a gate conductor and gate dielectric and, thereby as a back gate.

Some level of FET back biasing and, particularly, applying a first gate bias voltage (VPWp) to the Pwell 203p below the PFETs to back bias those PFETs and applying a second gate bias voltage (VPWn) to the Pwell 203n below the NFETs to back bias those NFETs can be employed to fine tune the VTs of the FETs, and thereby achieve target switching speeds. Forward back biasing (FBB) refers specifically to applying a bias voltage that will reduce the FET VT, thereby increasing the switching speed. Generally, for PFETs, FBB is achieved by applying a negative bias voltage (Vnb) to the Pwell 203p below; whereas, for NFETs, FBB is achieved by applying a positive bias voltage (Vpb) to the Pwell 203p below. Reverse back biasing (RBB) refers specifically to applying a bias voltage that will increase the FET VT, thereby decreasing the switching speed. Generally, for PFETs, RBB is achieved by applying a Vpn to the Pwell 203p below; whereas, for NFETs, RBB is achieved by applying a Vnb to the Pwell 203n below.

Referring again to FIG. 1, the structure 100 can include a power managed circuit, which is operable in either a functional mode (also referred to herein as a normal mode of operation) or a power saving mode (referred to herein interchangeably as a retention mode, standby mode or a suspend mode). During the functional mode, all sections of the circuit can be powered on and activity of the circuit can be monitored. If a period of inactivity (as defined by some predetermined period of time during which the circuit remains idle) is detected, operation of the circuit in the power saving mode can be initiated. As with conventional power management schemes, during the power saving mode, the power supply to one or more sections of the circuit will be stopped (i.e., one or more sections of the circuit will be powered down), but at least one section will remain powered on (i.e., an always on (AON) section 170, as discussed in greater detail below). Power management components that enable some sections of a structure to power down during a power saving mode are well known in the art. Thus, the details thereof have been omitted from this disclosure to allow the reader to focus on the salient aspects of the disclosed embodiments related to novel structures and methods that enable power saving within the AON section 170 during the power saving mode.

The AON section 170 could be any circuit section that requires a power supply even during the power saving mode. Such an AON section 170 can include a logic control block for controlling modes of operation, an event monitor for triggering wake-up, a power supply, a clock, an input/output device (e.g., an input buffer), a retention memory, or any other section of the structure 100 that needs to remain powered on during the power saving mode. In any case, in an advanced semiconductor-on-insulator technology platform (e.g., the FDSOI platform), the AON section 170 can include at least one NFET 171 and at least one PFET 172, each having back gates to facilitate back biasing (e.g., FBB or RBB). The NFET(s) 171 and PFET(s) 172 can be configured, for example, as described above with regard to the NFET 220 and PFET 210 shown in FIGS. 2A-2D.

Figure 3:
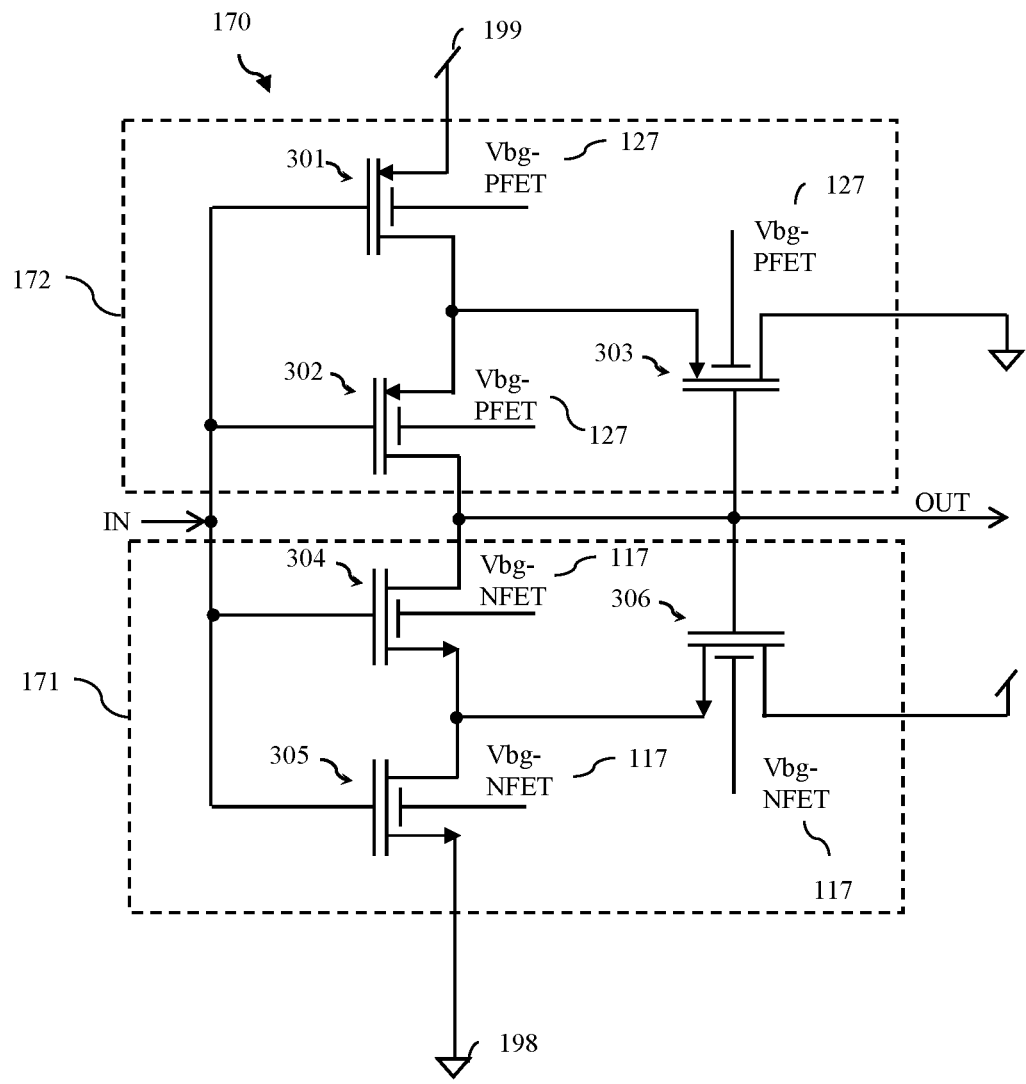
FIG. 3 is a schematic diagram illustrative of an AON input buffer that can be incorporated into the structure of FIG. 1.

FIG. 3 is a schematic diagram illustrative of an AON section 170 that could be incorporated into the structure 100 of FIG. 1. For purposes of illustration, the AON section 170 shown in FIG. 3 includes an AON input buffer, which is always on (e.g., see the connections to both the positive voltage rail 199 for receiving a positive supply voltage (VDD) and a ground rail 198). The AON input buffer can include a chain of FETs connected in series between the positive voltage rail 199 and ground 198. The FETs in the chain can include two PFETs 301-302 and two NFETs 304-305. The gates of the PFETS 301-302 and NFETs 304-305 in the chain can be connected to a data input node (IN). A data output node (OUT) can be located at a junction between the PFET 302 and the NFET 304. The AON input buffer can optionally include an additional PFET 303 and an additional NFET 306. As illustrated, the additional PFET 303 can have a source region connected to the junction between the PFETs 301-302, a drain region connected to ground, and a gate connected to the output node. The additional NFET 306 can have a source region connected to the junction between the NFETs 304-305, a drain region connected to the positive voltage rail, and a gate connected to the output node.

Those skilled in the art will recognize that in such a configuration the additional PFET 303 and the additional NFET 306 provide hysteresis to ensure that OUT does not switch in response voltage level fluctuations at in cause by noise. Specifically, OUT will remain at a high voltage level until IN increases above a rising IN switching threshold. Once the rising IN switching threshold is reached, OUT will switch to a low voltage level. To avoid having OUT switching repeatedly in response to noise at IN (e.g., in response to small fluctuations in the voltage level of IN near the rising IN switching threshold), once OUT switches to the low voltage level, it will not be pulled back up to the high voltage level until IN drops below a falling IN switching threshold the is below the rising IN switching threshold. The rising IN switching threshold is set by NFET 306, which switches to the on state when OUT is high to prevent pull-down of OUT until the rising IN switching threshold is met. The falling IN switching threshold is set by PFET 303, which switches to the on state when OUT is low to prevent pull-up of OUT until the falling IN switching threshold is met.

In any case, within the input buffer shown in FIG. 3, the NFETs 304-306 and PFETs 301-303 can be configured, for example, as described above with regard to the NFET 220 and PFET 210 shown in FIGS. 2A-2D such that they have biasable back gates.

It should be understood that the AON input buffer shown in FIG. 3 is provided for illustration purposes only and is not intended to be limiting. The AON section 170 could, alternatively, be a differently configured AON input buffer. Alternatively, the AON section 170 could be any other section of a power managed circuit that must remain powered on in the power saving mode.

Referring again to FIG. 1, the structure 100 can further include a positive charge pump 110 and a negative charge pump 120. A positive charge pump 110 is a device configured to generate a relatively high positive voltage (Vp) that is greater than VDD (e.g., a positive voltage of 2*VDD, 3*VDD, etc.) and to output Vp at a Vp node 111. A negative charge pump 120 is a device configured to generate a relatively high negative voltage (Vn) (e.g., a negative voltage of –1*VDD, –2*VDD, etc.) and to output Vn at a Vn node 121. Such charge pumps employ capacitors for charge storage to raise Vp above VDD in the case of a positive charge pump or lower Vn below ground in the of a negative charge pump. Various positive and negative charge pump configurations are well known in the art and, thus, the details thereof have been omitted from this specification to allow the reader to focus on the salient aspects of the disclosed embodiments related to novel structures and methods that enable power saving within the AON section 170 during the power saving mode.

The structure 100 can further a positive bias voltage generator 115 and a negative bias voltage generator 125. The positive bias voltage generator 115 can be connected to receive Vp from the positive charge pump 110 and can further be connected to receive positive bias voltage trim bits (e.g., from a register (not shown)). The positive bias voltage generator 115 can further be configured to generate a positive bias voltage (Vpb) by adjusting Vp as indicated by the positive bias voltage trim bits and to output Vpb. The negative bias voltage generator 125 can be connected to receive Vn from the negative charge pump 120 and can further be connected to receive negative bias voltage trim bits (e.g., from a register (not shown)). The negative bias voltage generator 125 can further be configured to generate a negative bias voltage (Vnb) by adjusting Vn as indicated by the negative bias voltage trim bits and to output Vnb. Such positive and negative bias voltage generators are well known in the art and, thus, the details thereof have been omitted from this specification to allow the reader on the salient aspects of the disclosed embodiments related to novel structures and methods that enable power saving within the AON section 170 during the power saving mode.

It should be noted that the positive and negative trim bits received by the positive and negative bias voltage generators can be operation-mode dependent. That is, switching operation modes (e.g., switching from the functional mode to the power saving mode or switching from the power saving mode to the functional mode) can, for example, be initiated by switching of one or more mode enable signals (e.g., see the power saving mode enable signal (RET_N), discussed below). Switching of the mode enable signal(s) can trigger resetting of the positive bias voltage trim bits received by the positive bias voltage generator 115 and the negative bias voltage trim bits received by the negative bias voltage generator 125 so that the bias voltage generators 115 and 125 receive different trim bits depending upon the operation mode. Thus, the Vpb and Vnb output by the bias voltage generators 115 and 125 in the different operating modes (e.g., in the functional mode as compared to in the power saving mode) can be different, as discussed in greater detail below.

The structure 100 can further include a multi-way switch 150 connected between the bias voltage generators 115 and 125 and the AON section 170. Specifically, the multi-way switch 150 can have two inputs (i.e., a first input 116 and a second input 126) and two outputs (i.e., a first output 117 and a second output 127). The first input 116 can be connected to the positive bias voltage generator 115 and can receive Vpb therefrom. The second input 126 can be connected to the negative bias voltage generator 125 and can receive Vnb therefrom. The first output 117 can be electrically connected to the AON section 170 and, particularly, to the NFET(s) 171 therein to enable back gate biasing of the NFET(s) 172 by the bias voltage output at the first output 117 (depending upon the electrical connections established by the multi-way switch 150). For example, see the electrical connections illustrated in FIG. 3 between the back gates of the NFETs 304-306 and the first output 117 of the multi-way switch 150. The second output 127 can be electrically connected to the AON section 170 and, particularly, to the PFET(s) 172 therein to enable back gate biasing of the PFET(s) 172 by the bias voltage output at the second output 127 (again depending upon the electrical connections established by the multi-way switch 150). For example, see the electrical connections illustrated in FIG. 3 between the back gates of the PFETs 301-303 and the second output 127 of the multi-way switch 150.

The structure 100 can further include switch control circuitry for the multi-way switch 150. This switch control circuitry can be configured for generating and outputting the select signals to the multi-way switch 150. Depending upon the values of the select signals, they will either cause the multi-way switch 150 to electrically connect the first input 116 and the second input 126 to the first output 117 and the second output 127, respectively, or cause the multi-way switch 150 to electrically connect the first input 116 and the second input 126 to the second output 127 and the first output 117, respectively. Since the first input 116 receives Vpb, the first output 117 is connected to NFET back gates, the second input 126 receives Vnb, and the second output 127 is connected to PFET back gates, causing the multi-way switch 150 to establish electrical connections between the first input 116 and the first output 117 and between the second input 126 and the second output 127, results in forward back biasing (FBB) of the NFET(s) 171 and PFET(s) 172 to decrease the respective VTs. Since the first input 116 receives Vpb, the first output 117 is connected to NFET back gates, the second input 126 receives Vnb, and the second output 127 is connected to PFET back gates, causing the multi-way switch 150 to establish electrical connections between the first input 116 and the second output 127 and between the second input 126 and the first output 117, results in reverse back biasing (RBB) of the NFET(s) 171 and PFET(s) 172 to increase the respective VTs.

As discussed below, generation of the select signals by the switch control circuitry can be dependent, at least in part, on the mode of operation of the circuit (e.g., depending on whether the circuit is operating in a power saving mode or a functional mode). Specifically, the switch control circuitry can be configured to generate operating mode-dependent select signals to ensure that, at least in the power saving mode in the IC, the generated select signals will cause the multi-way switch 150 to establish electrical connections between the two inputs and the two outputs resulting in RBB of the NFET(s) 171 and PFET(s) 172. Doing so raises the VTs of the FETs within the AON section 170 and thereby minimize leakage current from the AON section 170 to save power. Since, as mentioned above, the first input 116 receives Vpb, the first output 117 is connected to NFET back gates, the second input 126 receives Vnb, and the second output 127 is connected to PFET back gates, causing the multi-way switch 150 to establish electrical connections between the first input 116 and the second output 127 and between the second input 126 and the first output 117, will result in RBB of the NFET(s) 171 and PFET(s) 172. The switch control circuitry can also be configured to ensure that, during the functional mode in the IC, the select signals can be generated so as to cause the multi-way switch 150 to establish electrical connections between the two inputs and the two outputs resulting in either RBB of NFET(s) 17 1and the PFET(s) 172 or FBB of the NFET(s) 171 and PFET(s) 172, depending upon the application. Thus, in the power saving mode, back biasing is limited to RBB, whereas, in the functional mode, back biasing is not limited to RBB (i.e., it can be either FBB or RBB).

It should be noted that, as mentioned above, the positive bias voltage trim bits supplied to the positive bias voltage generator 115 for Vpb generation and the negative bias voltage trim bits supplied to the negative bias voltage generator 125 for Vnb generation can be switched upon initiation of different operating modes so that the Vpb and Vnb supplied to the multi-way switch 150 can be different during the different operating modes. Thus, the Vpb and the Vpn supplied to the multi-way switch 150 during a functional mode can be set to facilitate optimal performance, whereas the Vpb and the Vnb supplied to the multi-way switch 150 during the power saving mode can be set to enable performance as necessary but with minimal leakage for power saving.

In some embodiments of the structure 100, the multi-way switch 150 can include multiple transmission gates (TGs) and the select signals can include a switch enable signal (En) and an inverted switch enable signal (Enb). Specifically, the TGs can include: a first transmission gate (TG1) including a PFET 151 and an NFET 152 connected in parallel between the first input 116 and the first output 117; a second transmission gate (TG2) including a PFET 153 and an NFET 154 connected in parallel between the first input 116 and the second output 127; a third transmission gate (TG3) including a PFET 155 and an NFET 156 connected in parallel between the second input 126 and the first output 117; and a fourth transmission gate (TG4) including a PFET 157 and an NFET 158 connected in parallel between the second input 126 and the second output 127.

En can be received by the gates of the PFET of TG1, the NFET of TG2, the NFET of the TG3, and the PFET of TG4 such that the on/off states of these FETs are controlled by En. Enb can be received by the gates of the NFET of TG1, the PFET of TG2, the PFET of TG3, and the NFET of TG4 such that the on/off states of these FETs are controlled by Enb. Thus, if En is high and Enb is low, the PFET and NFET of TG1 are off, the PFET and NFET of TG3 are on, the PFET and NFET of TG2 are on, and the PFET and NFET of TG4 are off such that the first input 116 is connected to the second output 127 by TG2 and the second input 126 is connected to the first output 117 by TG3 for reverse back biasing. However, if En is low and Enb is high, the PFET and NFET of TG1 are on, the PFET and NFET of TG3 are off, the PFET and NFET of TG2 are off, and the PFET and NFET of TG4 are on such that the first input 116 is connected to the first output 117 by TG1 and the second input 126 is connected to the second output 127 by TG4 for forward back biasing. As discussed in greater detail below, the high and low values for En and Enb can correspond to the positive voltage (Vp) output from the positive charge pump 110 and the negative voltage (Vn) output from the negative charge pump 120 to ensure the desired on/off states are achieved.

In some embodiments of the structure 100, the switch control circuitry can include a control signal generator 101 and a level shifter 102.

The control signal generator 101 can be configured to generate and output a level shifter control signal (C) and an inverted level shifter control signal (Cb). The high and low values (i.e., the logic 1 and logic 0 values) of C and Cb can correspond to a positive supply voltage (VDD) and ground (VSS, e.g., 0V), respectively. Additionally, the specific logic values of C and Cb can be dependent on the operating mode of the power managed circuit. Specifically, the logic values C and Cb can depend upon: (a) whether a power saving mode (such as a retention mode, a sleep mode, a suspend mode, etc.) has been initiated in the circuit as indicated by a power saving mode enable signal (e.g., a retention mode enable signal (RET_N) so that RBB is to be performed; and (b) whether a functional mode has been initiated in the circuit and whether RBB or FBB is to be performed during the functional mode as indicated by a functional mode RBB enable signal (B).

The level shifter 102 can be connected so as to receive C and Cb from the control signal generator 101 and can further be configured to level shift C and Cb in both the positive direction and the negative direction to generate En and Enb and output En and Enb to the multi-way switch 150.

Figure 4:
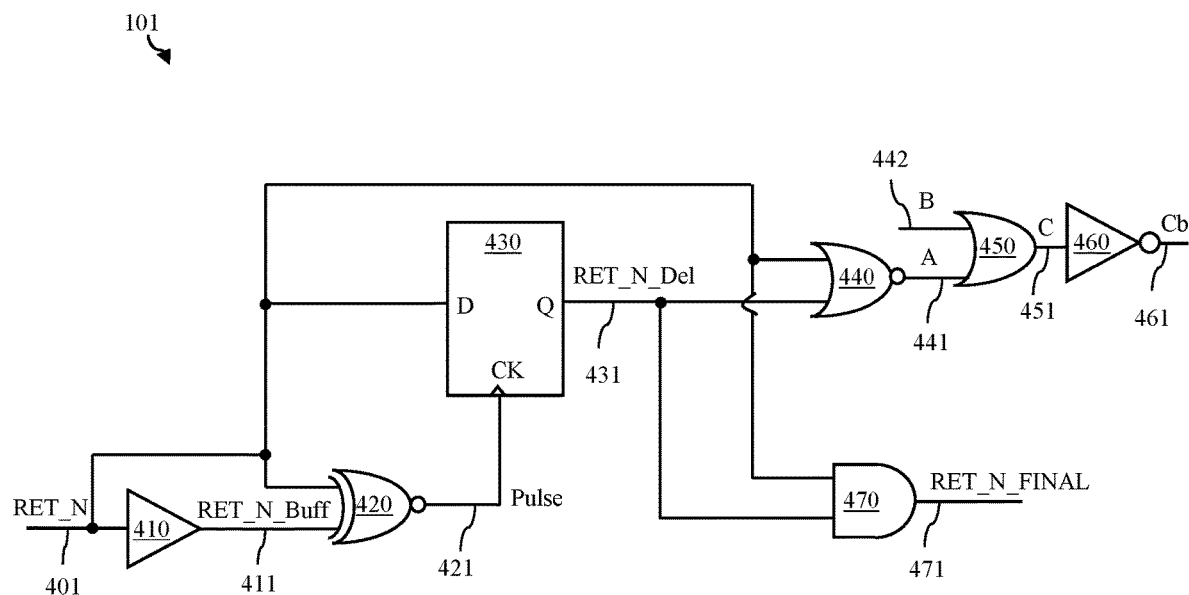
FIG. 4 is a schematic diagram illustrative of a control signal generator that can be incorporated into the structure of FIG. 1.

FIG. 4 is a schematic diagram illustrative of a control signal generator 101 that could be incorporated into the structure 100. The control signal generator 101 can include a buffer 410. The buffer 410 can receive the power saving mode enable signal (RET_N) 401 and can output a buffered power saving mode enable signal (RET_N_Buff) 411. RET_N_Buff 411 can be a slightly delayed version of RET_N 401. See timing of buffer 410, discussed in greater detail below. In this example, switching of RET_N 401 from high to low indicates initiation of the power saving mode. If RET_N 401 switches from high (i.e., a logic 1, VDD) to low (i.e., logic 0, VSS), RET_N_Buff 411 will similarly switch from high to low following some slight delay and vice versa.

The control signal generator 101 can further include an XNOR gate 420. The XNOR gate 420 can receive RET_N 401 and RET_N_Buff 411 as inputs and can output a pulse 421, given the conventional truth table for an XNOR gate. That is, when the inputs are both low or both high, then the output will be high (i.e., logic 1, VDD). However, when one input is low and one is high or vice versa, then the output will be low (i.e., logic 0, VSS). More specifically, when RET_N 401 and RET_N_buff 411 are both high (e.g., at VDD), the pulse 421 output from the XNOR gate 420 will also be high. However, when RET_N 401 switches from high to low (e.g., to VSS) but before RET_N 401 is processed by buffer 410, RET_N 401 and RET_N_Buff 411 will be different and the pulse 421 output from the XNOR gate 420 will switch to low. Once RET_N_Buff 411 switches to low, RET_N 401 and RET_N_Buff 411 will be the same again, and the pulse 421 output of the XNOR gate 420 will go high. When RET_N 401 switches back to high but before it is processed by buffer 410, RET_N 401 and RET_N_Buff 411 will again be different and the pulse 421 output from the XNOR gate 420 will again go low. Since the period of time during which RET_N 401 and RET_N_Buff 411 are different is limited to the amount of time it takes the buffer 410 to process RET_N 401 into RET_N_Buff 411 and since this amount of time is relatively short, the output of the XNOR gate 420 is effectively a quick pulse 421 to VSS and back to VDD.

The control signal generator 101 can further include a positive edge triggered flop 430, which receives RET_N 401 as the data in (D) and which outputs a delayed power saving mode enable signal (RET_N_Del) 431 as the data out (Q). Timing of such a flop 430 can be controlled by the rising edge of the pulse 421. For example, as mentioned above, the pulse 421 switches from high to low and back again when RET_N 401 switches from high to low or vice versa. On the rising edge of the pulse 421 (i.e., when it is switching back to high), the state of D can be captured and output as Q with the resulting Q effectively being a delayed version of RET_N. It should be noted that RET_N_Del 431 can be delayed with respect to RET_N 401 but otherwise the same. That is, the pulse width, amplitude, and time period can be the same but shifted by some delay time. Additionally, it should be noted that, since the flop 430 is triggered by the rising edge of pulse 421, the delay of the buffer 410 should be equal to or greater than the set-up time of the flop 430.

The control signal generator 101 can further include an NOR gate 440. The NOR gate 440 can receive RET_N 401 and RET_N_Del 431 as inputs and can output a power saving mode RBB enable signal (A) 441, given the conventional truth table for a NOR gate. That is, when RET_N 401 and RET_N_Del 431 are both low, A 441 will be high (i.e., a logic 1, VDD). For all other combinations of RET_N 401 and RET_N_Del 431, A 441 will be low (i.e., a logic 0, VSS).

The control signal generator 101 can further include an OR gate 450. The OR gate 450 can receive A 441 and a functional mode RBB enable signal (B) 442 as inputs and can output the level shifter control signal (C) 451, given the conventional OR gate truth table. Specifically, if A 441 is high (indicating that the circuit is operating in the power saving mode), C 451 will also be high, regardless of whether B 442 is high or low. If both A 441 and B 442 are low (indicating that FBB is to be performed in the functional mode), C 451 will be low. If A 441 is low but B 442 is high (indicating that RBB is to be performed in the functional mode), then C 451 will be high.

The control signal generator 101 can further include an inverter 460. The inverter 460 can receive C 451 and can output the inverted level shifter control signal (Cb) 461. That is, if C 451 is high (i.e., logic 1, VDD), Cb 461 will be low (i.e., logic 0, VSS) and vice versa. As indicted, the high and low voltage levels of C and Cb will be at a positive supply voltage level (VDD) and ground (VSS).

The control signal generator 101 can further include an AND gate 470. The AND gate 470 can receive RET_N 401 and RET_N_Del 431 as inputs and can output a final power saving mode enable signal (RET_N_Final) 471, given a conventional AND truth table. That is, if RET_N 401 and RET_N_Del 431 are both high, RET_N_Final 471 will be high (i.e., a logic 1, VDD). For all other combinations of RET_N 401 and RET_N_Del 431, RET_N_Final 471 will be low (i.e., a logic 0, VSS). Thus, RET_N_Final 471 will have an extended pulse width and, particularly, will have the combined pulse width of RET_N 401 and RET_N_Del 431. That is, RET_N_Final 471 is high when both RET_N 401 and RET_N_Del 431 are both high, switches to low when RET_N 401 switches to low, stays low when RET_N_Del 431 switches to low, stays low when RET_N 401 switches back to high, and finally switches back to high when RET_N_Del 431 switches back to high.

Referring again to FIG. 1, the level shifter 102 can be a two-stage level shifter. It can include a first stage 130 that level shifts the high voltage level of C and Cb in a positive direction from VDD to Vp. It can also include a second stage 140 that level shifts the low voltage level of C and Cb in a negative direction from VSS to Vn.

Specifically, the first stage 130 can include two first branches (i.e., a first branch and an additional first branch) connected in parallel between a positive voltage node 111 at an output of the positive charge pump 110 (e.g., so as to receive Vp) and ground. These two first branches can each include series-connected P-channel and N-channel transistors (i.e., a PFET and an NFET connected in series). The gate of the PFET 131 in the first branch can be coupled to the junction 136 between the PFET 132 and the NFET 134 in the additional first branch. Furthermore, the gate of the PFET 132 in the additional first branch can be coupled to the junction 135 between the PFET 131 and NFET 133 in the first branch. Finally, the gates of the NFETs 133 and 134 in the two first branches can be connected to receive C 451 and Cb 461, respectively, from the control signal generator 101. With this configuration, an intermediate signal (Y) is output at the junction 136 and an inverted intermediate signal (Yb) is output at the junction 135. If C 451 is high (i.e., logic 1, VDD) and Cb 461 is low (i.e., logic 0, VSS), the NFET 133 turns on and pull Yb down to VSS, thereby turning on the PFET 132 so as to pull up Y up to Vp. Thus, the high and low voltage levels of Y and Yb are Vp and ground, respectively.

The second stage 140 can include two second branches (i.e., a second branch and an additional second branch) connected in parallel between the positive voltage node 111 at the output of the positive charge pump 110 (e.g., so as to receive Vp) and a negative voltage node 121 at the output of the negative charge pump 120 (e.g., so as to receive Vn). These two second branches can each include series-connected P-channel and N-channel transistors (i.e., a PFET and an NFET connected in series). However, in this second stage 140, the gate of the NFET 143 in the second branch is coupled to the junction 146 between the PFET 142 and NFET 144 in the additional second branch and the gate of the NFET 144 in the additional second branch is coupled to the junction between the PFET 141 and the NFET 143 in the second branch. Additionally, the gates of PFETs 141 and 142 in the two second branches are connected to the first stage 130 so as to receive Y and Yb, respectively. With this configuration, En is output at the junction 146 between the PFET 142 and NFET 144 in the additional second branch and Enb is output at the junction 145 between PFET 141 and the NFET 143 in the second branch. If Yb is at VSS, PFET 142 will turn on pulling up En to Vp, thereby turning on the NFET 143 and pulling down Enb to Vn (which as mentioned above is lower than VSS). Thus, the high and low voltage levels of En and Enb are Vp and Vn, respectively.

As mentioned above, En and Enb are the select signals that control the multi-way switch 150. When En is at Vp and Enb is at Vn, TG2 will connect the first input 116 to the second output 127 so that Vpb is applied to the back gates of the PFET(s) 172 for RBB and TG3 will connect the second input 126 to the first output 117 so that Vnb is applied to the back gates of the NFET(s) 171 for RBB.

Figure 5A:
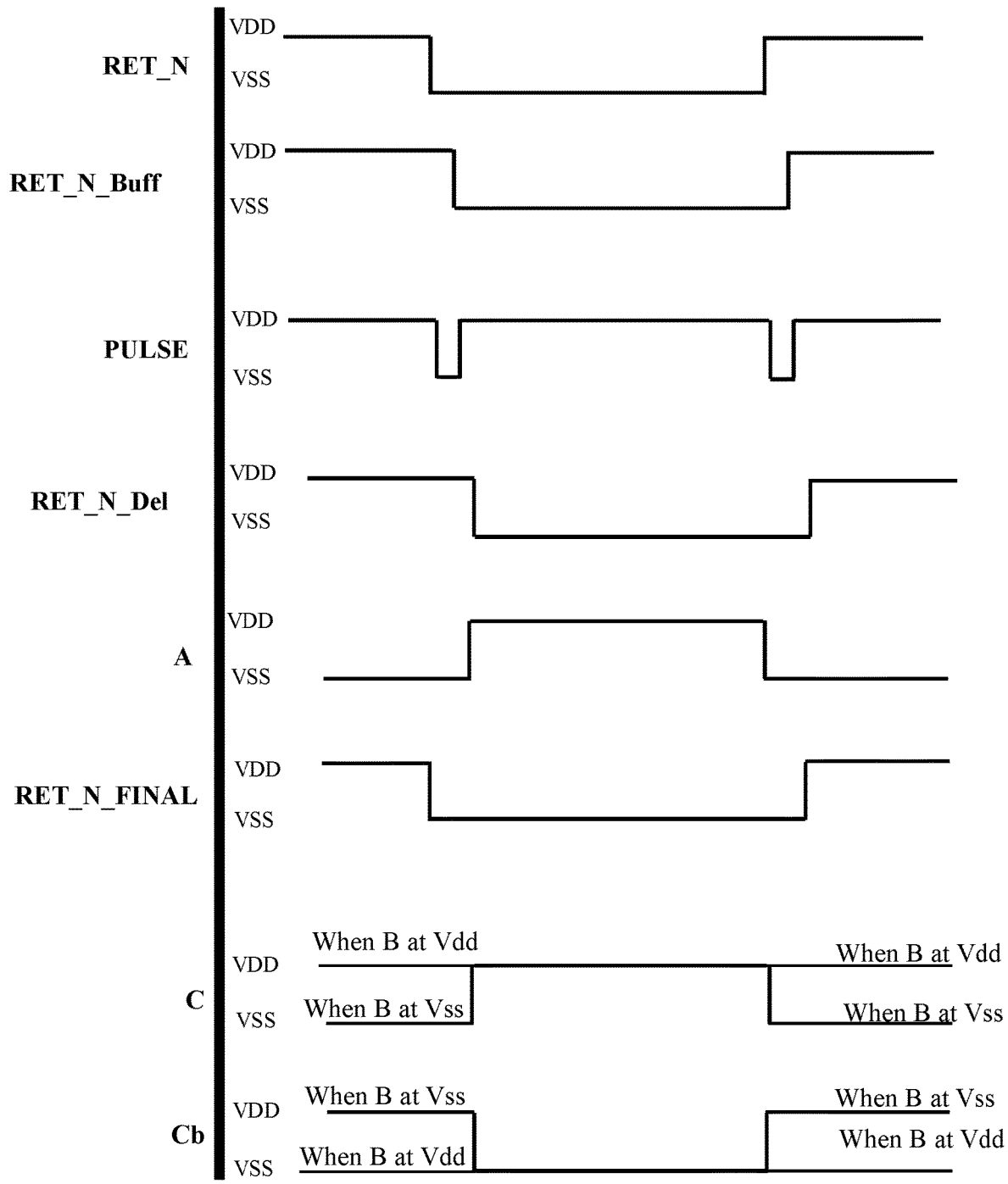
FIGS. 5A and 5B are timing diagrams illustrating various signals generated during operation of the control signal generator and the level shifter, respectively.

FIG. 5A is a timing diagram illustrating the various signals mentioned above with regard to operation of the control signal generator 101. These signals include RET_N, RET_N_Buff, Pulse, RET_N_Del, A, RET_N_Final, B, C and Cb. As illustrated and discussed above, C will be high if the power saving mode is initiated (e.g., so RBB is to be performed) and C will also be high if the functional mode is initiated and RBB is selected to be performed. C will be low if the function mode is initiated and FBB is selected to be performed.

Figure 5B:
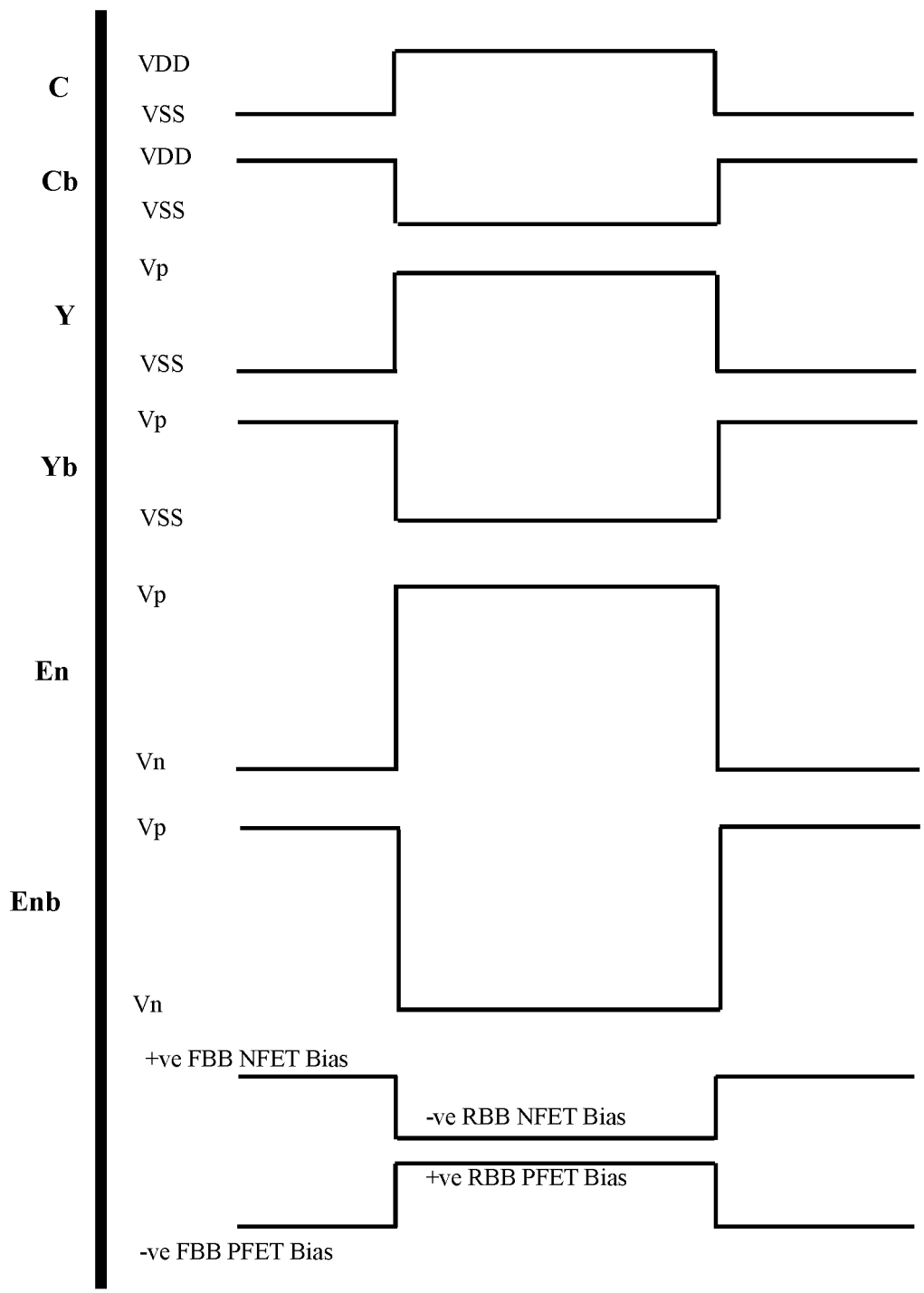

FIG. 5B is a timing diagram illustrating the various signals mentioned above with regard to operation of the level shifter 102 in response to C and Cb. These signals include: C, Cb, Y, Yb, En and Enb.

Figure 6:
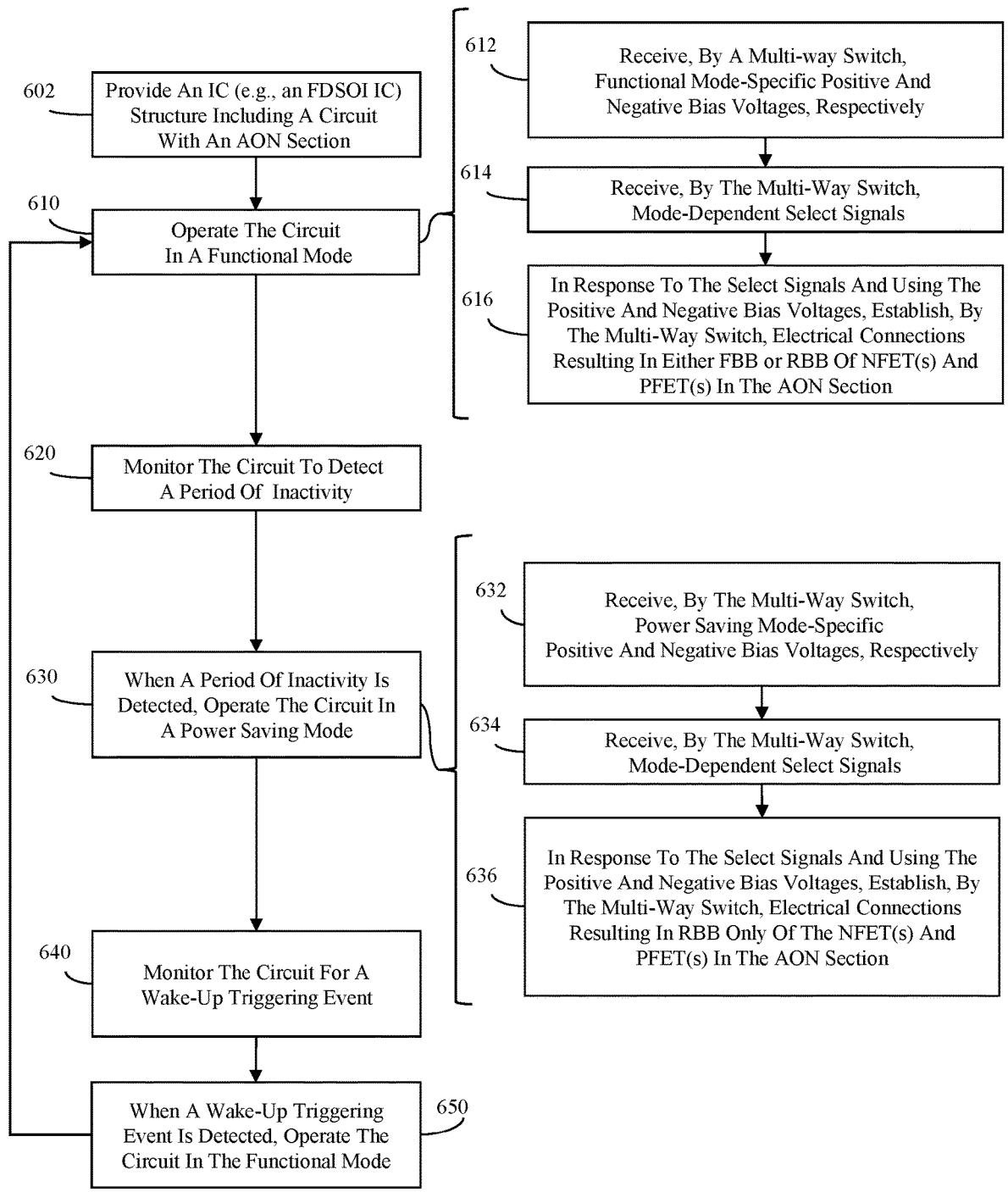
FIG. 6 is a flow diagram illustrating embodiments of a disclosed method.

It should be noted that switching of the power saving mode RBB enable signal (A) from low to high and then back to low is controlled by both RET_N 401 and RET_N_Del 431. RET_N 401 and RET_N_Del 431 also control RET_N_Final 471 and, thereby, control safe transition to the power saving mode and a quick wake-up from the power saving mode. Thus, RET_N_Final 471 can be used by a system incorporating the disclosed embodiments to make sure it is operating safely. Specifically, the control signal generator 101 is configured to ensure that, in the power saving mode, RBB is only initiated after RET_N_Final goes low. The control signal generator 101 is further configured to ensure that, prior to wake-up from the power saving mode, RBB can be halted before RET_N_Final switches back to high. Thus, the AON section devices are at the desired bias (RBB or FBB) immediately prior to wake-up and faster wakeup is achieved. n Referring to the flow diagram of FIG. 6 in combination with FIGS. 1-5, also disclosed herein are method embodiments for operating an IC structure, such as the structure 100, which includes a circuit configured for power management with reduced leakage current from an AON section during a power saving mode and which is described in detail above and illustrated in FIG. 1 with reference to FIGS. 2-5 (see process 602).

The method can further include operating a circuit of the structure 100 in a functional mode of operation (also referred to herein as a normal mode of operation) (see process 610). Operating in the functional mode at process 610 can include maintaining all sections therein, including non-AON sections and any AON sections, in a powered on state. Operating in the functional mode at process 610 can further include providing functional mode-specific positive and negative trim bits to the positive and negative bias voltage generators 115 and 125, respectively, thereby causing the positive and negative bias voltage generators 115 and 125 to output functional mode-specific bias voltages (i.e., bias voltages Vpb and Vnb that are specific to the functional mode) (see process 612). Operating in the functional mode at process 610 can further include generating, by switch control circuitry (e.g., a control signal generator 101 and level shifter 102) of the structure 100, select signals (see process 614). Operating in the functional mode at process 610 can further include providing, by the switch control circuitry, the select signals to a multi-way switch 150 (see process 616). As discussed in detail above, this multi-way switch 150 can have two inputs connected to the positive and negative bias voltage generators 115-125, respectively, and two outputs connected to enable back biasing of NFET(s) 171 and PFET(s) 172, respectively, of an AON section 170. The values of the select signals provided to the multi-way switch 150 during the functional mode can be set so that they cause the multi-way switch 150 to establish electrical connections resulting in either FBB of the NFET(s) 171 and PFET(s) 172 or RBB of the NFET(s) 171 and PFET(s) 172 depending upon the function mode performance requirements.

The method can further include monitoring the circuit to detect a period of inactivity (e.g., monitoring to detect when the circuit has remained idle for some predetermined period of time) (see process 620). Detecting the period of inactivity can trigger switching of operation of the circuit from the functional mode to a power saving mode (see process 630). Operating in the power saving mode at process 630 can include powering down some sections, while leaving the AON section(s) 170 in a powered on state (i.e., while continuing to provide a power supply to each AON section 170). Operating in the power saving mode at process 630 can further include providing power saving mode-specific positive and negative trim bits to the positive and negative bias voltage generators 115 and 125, respectively, thereby causing the positive and negative bias voltage generators 115 and 125 to output power saving mode-specific bias voltages (i.e., bias voltages Vpb and Vnb that are specific to the power saving mode) (see process 632). Operating in the power saving mode at process 630 can further include generating, by switch control circuitry (e.g., a control signal generator 101 and level shifter 102) of the structure 100, select signals (see process 634). Operating in the power saving mode at process 630 can further include providing, by the switch control circuitry, the select signals to the multi-way switch 150 (see process 636). As discussed in detail above, the values of the select signals provided to the multi-way switch 150 during the power saving mode can be set specifically so that they cause this multi-way switch 150 to establish electrical connections resulting only in RBB of the NFET(s) 171 and PFET(s) 172 to increase their VTs and thereby minimize leakage current.

The method can further include monitoring the structure 100 to detect wake-up triggering events (e.g., events, such as user inputs or other events, indicating that circuit functional operation is required) (see process 640). Detecting a wake-up triggering event can trigger switching of operation back to the functional mode (see process 650). Thus, processes 610-650 can be iteratively repeated during circuit operation.

In the structure and method embodiments described above, a semiconductor material refers to a material whose conducting properties can be altered by doping with an impurity. Such semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

It should be understood that the terminology used herein is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
 a section of a circuit, wherein the section includes at least one N-channel transistor and at least one P-channel transistor and wherein the circuit is operable in a power saving mode; and
 a multi-way switch having two inputs and two outputs and connected to receive select signals,
  wherein the two inputs include a first input connected to receive a positive bias voltage and a second input connected to receive a negative bias voltage,
  wherein the two outputs include a first output connected to back bias the at least one N-channel transistor and a second output connected to back bias the at least one P-channel transistor, and
  wherein, in the power saving mode, the select signals cause the multi-way switch to establish an electrical connection between the first input and the second output and an additional electrical connection between the second input and the first output resulting in reverse back biasing of the at least one N-channel transistor and the at least one P-channel transistor.

2. The structure of claim 1, wherein, in the power saving mode, the electrical connection established by the multi-way switch between the first input and the second output causes the positive bias voltage reverse back biases the at least one P-channel transistor and the additional electrical connection established by the multi-way switch between the second input and the first output causes the negative bias voltage reverse back biases the at least one N-channel transistor.

3. The structure of claim 1, wherein the circuit is further operable in a functional mode and wherein, in the functional mode, the select signals cause the multi-way switch to establish electrical connections between the two inputs and the two outputs resulting in any one of reverse back biasing of the at least one N-channel transistor and the at least one P-channel transistor in the section and forward back biasing of the at least one N-channel transistor and the at least one P-channel transistor in the section.

4. The structure of claim 1, further comprising:
a positive charge pump outputting a positive voltage;
a positive bias voltage generator connected to receive the positive voltage from the positive charge pump, connected to receive positive bias voltage trim bits, generating the positive bias voltage using the positive voltage and the positive bias voltage trim bits, and outputting the positive bias voltage to the first input of the multi-way switch;
a negative charge pump outputting a negative voltage; and
a negative bias voltage generator connected to receive the negative voltage from the negative charge pump, connected to receive negative bias voltage trim bits, generating the negative bias voltage using the negative voltage and the negative bias voltage trim bits, and outputting the negative bias voltage to the second input of the multi-way switch.

5. The structure of claim 4,
wherein the structure further comprises: a level shifter; and a control signal generator,
wherein the control signal generator outputs a control signal and an inverted control signal that are mode-dependent,
wherein the level shifter is connected to receive the control signal and the inverted control signal and generates and outputs a switch enable signal and an inverted switch enable signal that are level shifted to have high and low voltages at the positive voltage and the negative voltage, respectively, and
wherein the select signals include the switch enable signal and the inverted switch enable signal.

6. The structure of claim 5, wherein, when the control signal has a logic value of 1 and the inverted control signal has a logic value of 0, the level shifter outputs the switch enable signal and the inverted switch enable signal to cause the multi-way switch to establish the electrical connections resulting in the reverse back biasing.

7. The structure of claim 5,
wherein the multi-way switch includes multiple transmission gates including:
a first transmission gate connected between the first input and the first output;
a second transmission gate connected between the first input and the second output;
a third transmission gate connected between the second input and the first output; and
a fourth transmission gate connected between the second input and the second output,
wherein each of the multiple transmission gates includes parallel-connected P-channel and N-channel transistors,
wherein the switch enable signal is received by gates of a P-channel transistor of the first transmission gate, an N-channel transistor of the second transmission gate, an N-channel transistor of the third transmission gate, and a P-channel transistor of the fourth transmission gate, and
wherein the inverted switch enable signal is received by gates of an N-channel transistor of the first transmission gate, a P-channel transistor of the second transmission gate, a P-channel transistor of the third transmission gate, and an N-channel transistor of the fourth transmission gate.

8. The structure of claim 1, wherein the section includes an input buffer comprising the at least one N-channel transistor and the at least one P-channel transistor.

9. A structure comprising:
a section of a circuit, wherein the section includes at least one N-channel transistor and at least one P-channel transistor and wherein the circuit is operable in a power saving mode;
a multi-way switch with two inputs and two outputs, wherein the two inputs include a first input connected to receive a positive bias voltage and a second input connected to receive a negative bias voltage, and wherein the two outputs include a first output connected to back bias the at least one N-channel transistor and a second output connected to back bias the at least one P-channel transistor;
a level shifter; and
a control signal generator,
wherein the control signal generator generates and outputs a control signal and an inverted control signal that are dependent on a mode of operation of the circuit,
wherein the level shifter is connected to receive the control signal and the inverted control signal and generates and outputs select signals based on the control signal and the inverted control signal,
wherein the multi-way switch receives the select signals, and
wherein, in the power saving mode, the select signals cause the multi-way switch to establish electrical connections between the two inputs and the two outputs resulting in reverse back biasing of the at least one N-channel transistor and the at least one P-channel transistor.

10. The structure of claim 9, wherein, in the power saving mode, the electrical connections established by the multi-way switch include a first input-to-second output electrical connection so the positive bias voltage back biases the at least one P-channel transistor and a second input-to-first output electrical connection so the negative bias voltage back biases the at least one N-channel transistor.

11. The structure of claim 9, wherein the circuit is further operable in a functional mode and wherein, in the functional mode, the select signals cause the multi-way switch to establish electrical connections between the two inputs and the two outputs resulting in any one of reverse back biasing of the at least one N-channel transistor and the at least one P-channel transistor in the section and forward back biasing of the at least one N-channel transistor and the at least one P-channel transistor in the section.

12. The structure of claim 9, further comprising:
a positive charge pump outputting a positive voltage;
a positive bias voltage generator connected to receive the positive voltage from the positive charge pump, connected to receive positive bias voltage trim bits, generating the positive bias voltage using the positive voltage and the positive bias voltage trim bits, and further outputting the positive bias voltage to the first input of the multi-way switch;
a negative charge pump outputting a negative voltage; and
a negative bias voltage generator connected to receive the negative voltage from the negative charge pump, connected to receive negative bias voltage trim bits, generating the negative bias voltage using the negative voltage and the negative bias voltage trim bits, and further outputting the negative bias voltage to the second input of the multi-way switch.

13. The structure of claim 12,
wherein the control signal and the inverted control signal have high and low voltages at a supply voltage level and ground, respectively, wherein the level shifter includes a first stage and a second stage, wherein the first stage is connected to receive the control signal and the inverted control signal and to output an intermediate signal and an inverted intermediate signal with high and low voltages at the positive voltage and ground, respectively, wherein the second stage is connected to receive the intermediate signal and the inverted intermediate signal and to output a switch enable signal and an inverted switch enable signal with high and low voltages at the positive voltage and the negative voltage, respectively, and wherein the select signals include the switch enable signal and the inverted switch enable signal.

14. The structure of claim 13, wherein, when the control signal has a logic value of 1 and the inverted control signal has a logic value of 0, the level shifter outputs the switch enable signal and the inverted switch enable signal to cause the multi-way switch to establish the electrical connections resulting in the reverse back biasing.

15. The structure of claim 13, wherein the multi-way switch includes multiple transmission gates including:

a first transmission gate connected between the first input and the first output;

a second transmission gate connected between the first input and the second output;

a third transmission gate connected between the second input and the first output; and a fourth transmission gate connected between the second input and the second output, wherein each of the multiple transmission gates includes parallel-connected P-channel and N-channel transistors, wherein the switch enable signal is received by gates of a P-channel transistor of the first transmission gate, an N-channel transistor of the second transmission gate, an N-channel transistor of the third transmission gate, and a P-channel transistor of the fourth transmission gate, and wherein the inverted switch enable signal is received by gates of an N-channel transistor of the first transmission gate, a P-channel transistor of the second transmission gate, a P-channel transistor of the third transmission gate, and an N-channel transistor of the fourth transmission gate.

16. The structure of claim 9, wherein the control signal generator comprises:

a buffer receiving a power saving mode enable signal and outputting a buffered power saving mode enable signal;

an XNOR gate receiving the power saving mode enable signal and the buffered power saving mode enable signal and outputting a pulse;

a positive edge triggered flop receiving the power saving mode enable signal and the pulse and outputting a delayed power saving mode enable signal;

an NOR gate receiving the power saving mode enable signal and the delayed power saving mode enable signal and outputting a power saving mode reverse back bias enable signal;

an OR gate receiving the power saving mode reverse back bias enable signal and a functional mode reverse back bias enable signal and outputting the control signal;

an inverter receiving the control signal and outputting the inverted control signal; and an AND gate receiving the power saving mode enable signal and the delayed power saving mode enable signal and outputting a final power saving mode enable signal with an extended pulse width.

17. A method comprising:

receiving select signals, wherein the select signal are received by a multi-way switch of a structure, wherein the structure includes:

a section of a circuit, wherein the section includes at least one N-channel transistor and at least one P-channel transistor and wherein the circuit is operable in a power saving mode; and the multi-way switch, wherein the multi-way switch has two inputs and two outputs, wherein the two inputs include a first input connected to receive a positive bias voltage and a second input connected to receive a negative bias voltage, and wherein the two outputs include a first output connected to back bias the at least one N-channel transistor and a second output connected to back bias the at least one P-channel transistor; and establishing, by the multi-way switch in response to the select signals received in the power saving mode, an electrical connections between the first input and the second output and an additional electrical connection between the second input and the first output resulting in reverse back biasing of the at least one N-channel transistor and the at least one P-channel transistor in the section.

18. The method of claim 17, wherein, in the power saving mode, the electrical connections established by the multi-way switch between the first input and the second output causes the positive bias voltage reverse back biases the at least one P-channel transistor and the additional electrical connection established by the multi-way switch between the second input and the first output causes the negative bias voltage reverse back biases the at least one N-channel transistor.

19. The method of claim 17, wherein the circuit is further operable in a functional mode and wherein the method further comprises establishing, by the multi-way switch in response to the select signals received in the functional mode, electrical connections between the two inputs and the two outputs resulting in forward back biasing of the at least one N-channel transistor and the at least one P-channel transistor in the section.

20. The method of claim 17, wherein the section includes an input buffer comprising the at least one N-channel transistor and the at least one P-channel transistor.

* * * * *